(12) United States Patent
Arai et al.

(10) Patent No.: US 7,394,337 B2
(45) Date of Patent: Jul. 1, 2008

(54) MULTILAYER INTERCONNECTION BOARD

(75) Inventors: Tatsuya Arai, Kanagawa (JP); Toshiyuki Takada, Kanagawa (JP)

(73) Assignee: Hirose Electric Co., Ltd., Tokyo (JP)

( * ) Notice: Subject to any disclaimer, the term of this patent is extended or adjusted under 35 U.S.C. 154(b) by 113 days.

(21) Appl. No.: 11/290,681

(22) Filed: Dec. 1, 2005

(65) Prior Publication Data
US 2006/0164179 A1 Jul. 27, 2006

(30) Foreign Application Priority Data
Jan. 26, 2005 (JP) ............................. 2005-017645

(51) Int. Cl.
*H01P 3/08* (2006.01)
(52) U.S. Cl. ........................... 333/260; 333/33; 333/34
(58) Field of Classification Search .................... 333/33, 333/34, 35, 260
See application file for complete search history.

(56) References Cited

U.S. PATENT DOCUMENTS

| | | | | |
|---|---|---|---|---|
| 5,194,979 | A | * | 3/1993 | Koai et al. .................. 398/202 |
| 6,215,377 | B1 | | 4/2001 | Douriet et al. |
| 6,661,316 | B2 | * | 12/2003 | Hreish et al. ................. 333/246 |
| 7,187,249 | B2 | * | 3/2007 | Nicholson et al. ............. 333/33 |
| 2001/0054939 | A1 | * | 12/2001 | Zhu et al. ...................... 333/33 |

FOREIGN PATENT DOCUMENTS

| | | |
|---|---|---|
| JP | 2001-44716 | 2/2001 |
| JP | 2004-14800 | 1/2004 |

* cited by examiner

*Primary Examiner*—Stephen E Jones
(74) *Attorney, Agent, or Firm*—Kubotera & Associates, LLC

(57) ABSTRACT

A multilayer interconnection board (10) comprises a dielectric substrate (11), a through-hole (15), a signal line (12) having a large width section (12A) and a small width section (12B) connected with the through-hole (15), and a ground layer (13, 14). A length L (mm) of the small width section (12B) meets the formula of $0 < L \leq (3 \times 10^{10})/(F \times \sqrt{\epsilon})$, wherein, $\epsilon$ denotes the dielectric constant of the dielectric substrate (11) and F (Hz) denotes the frequency of a signal transmitted through the signal line (12). The ratio (W2/W1) of a line width W2 of the small width section (12B) relative to a line width W1 of the large width section (12A) is determined to be smaller as the length of a stub portion of the through-hole (15) becomes larger.

8 Claims, 8 Drawing Sheets

MULTILAYER INTERCONNECTION BOARD

BACKGROUND OF THE INVENTION

The present invention relates to a multilayer interconnection board, especially a multilayer interconnection board suitable for a strip line structure or micro-strip line structure.

It is possible to adjust the characteristic impedance of the multilayer interconnection board by adjusting a thickness of a dielectric substrate made of a dielectric, a dielectric constant of the dielectric, a line width of a signal line, a distance between a ground layer and the signal line, and so forth. However, when the signal line is connected with a capacitive load, such as a through-hole, the characteristic impedance is reduced because of the increase of a capacitive component in the vicinity of the through-hole. If the characteristic impedance is reduced in the vicinity of the through-hole, a signal reflection, which is generated by an unconformity of the impedance, degrades a high-speed signal. Especially, if the through-hole includes a stub, the characteristic impedance is reduced remarkably and the degradation of a high-speed signal becomes serious.

It is disclosed in Japanese Patent Application Unexamined Number 2004-14800 that when a multilayer interconnection board is provided with a pair of signal conductors performing a data differential transmission, the differential impedance can be adjusted by extending the distance between the pair of signal conductors in the though-hole.

The above method, however, cannot be used for a wiring pattern of high density

BRIEF SUMMARY OF THE INVENTION

Therefore, an object of the present invention is to provide a multilayer interconnection board capable of increasing the high frequency characteristics by controlling a signal reflection which is generated by an unconformity of the impedance of a signal line connected with a capacitive load, such as a through-hole.

A multilayer interconnection board according to the present invention comprises a dielectric substrate, at least one capacitive load provided in the dielectric substrate, at least one signal line having a large width section and a small width section connected with the large width section at an end thereof and the capacitive load at the other end thereof, and at least one ground layer provided on a surface of or in the dielectric substrate.

In such a multilayer interconnection board, the length L (mm) of a small width section meets a formula of:

$$0 < L \leq (3 \times 10^{10})/(F \times \sqrt{\epsilon})$$

wherein, $\epsilon$ denotes the dielectric constant of the dielectric substrate and F (Hz) denotes the frequency of a signal transmitted through the signal line.

The characteristic impedance in the vicinity of the capacitive load is not reduced and maintained to be proper by setting the length L to meet the above formula.

In the present invention, the capacitive load is, for example, a through-hole.

It is preferable that the ratio (W2/W1) of the line width W2 of the small width section relative to the line width W1 of the large width section is determined to be smaller as the length of a stub portion of the through-hole becomes larger.

Thus, according to the present invention, the signal line has large and small width sections and the length of the small width section is adjusted to meet the formula, which is determined by the dielectric constant of the dielectric substrate and the frequency of the signal transmitted through the signal line in order to prevent the reduction of the characteristic impedance in the vicinity of the capacitive load or through-hole. Accordingly, in the present invention, since it is not necessary to extend the distance between the signal lines, a high density wiring pattern for the signal lines becomes possible.

DETAILED DESCRIPTION OF THE PRESENT INVENTION

Figure 1:
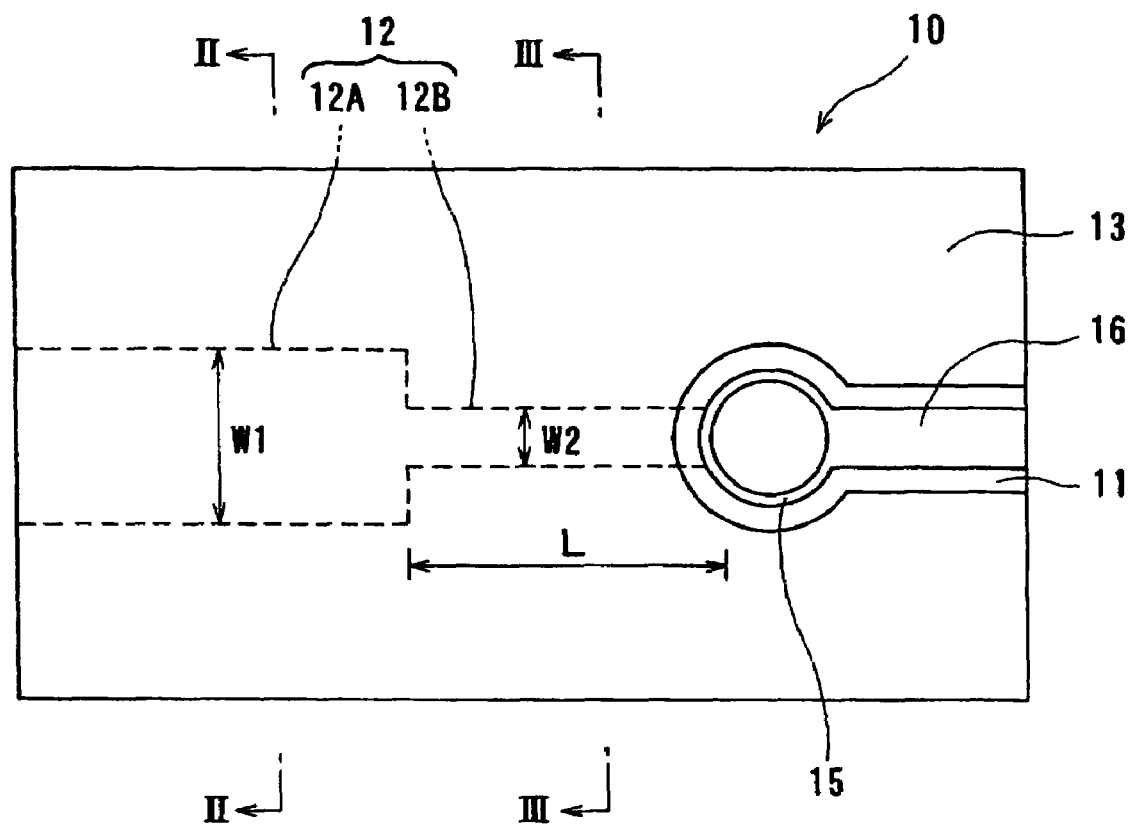
FIG. 1 is a top view of a multilayer interconnection board according to an embodiment of the present invention.
Figure 2:
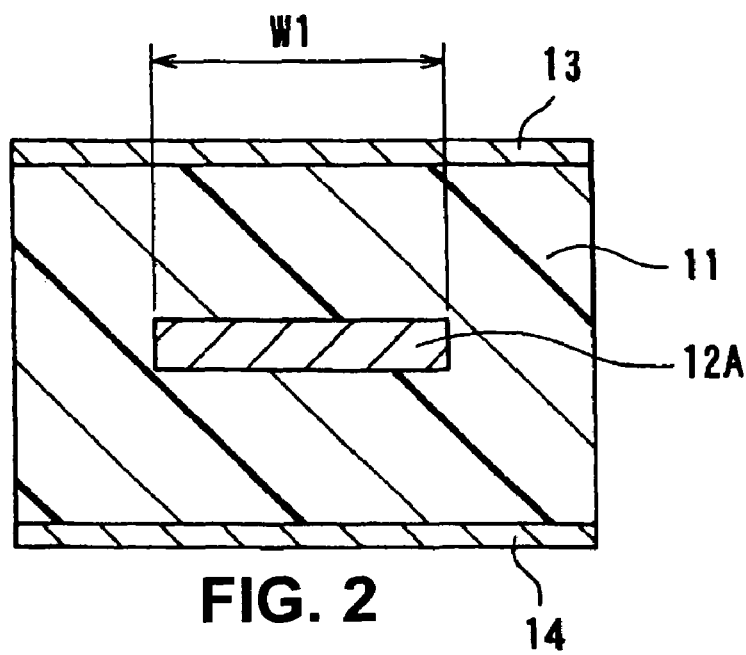
FIG. 2 is a sectional view of the multilayer interconnection board taken along line II-II of FIG. 1.
Figure 3:
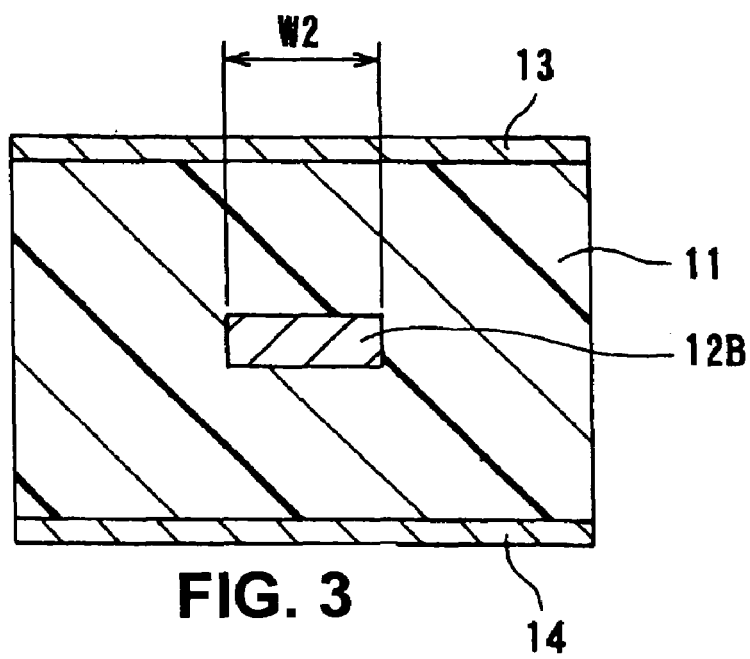
FIG. 3 is a sectional view of the multilayer interconnection board taken along line III-III of FIG. 1.
Figure 4:
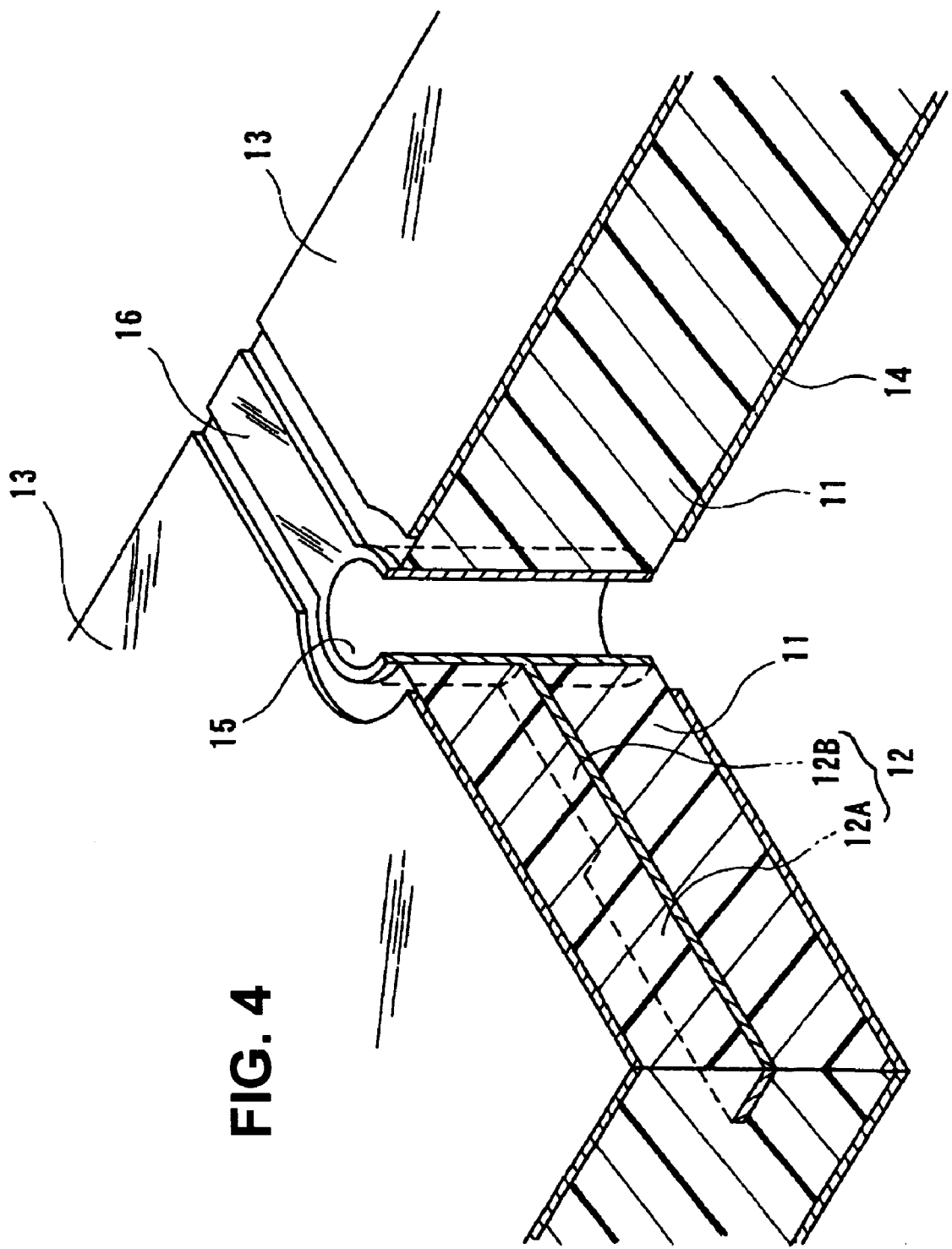
FIG. 4 is a perspective view, partly broken away, of the multilayer interconnection board of FIG. 1.

A multilayer interconnection board according to an embodiment of the present invention will be described below with respect to the accompanying drawings.

In FIGS. 1-4, a multilayer interconnection board 10 is of a strip line structure and comprises a dielectric substrate 11, a signal line 12 provided inside the dielectric substrate 11, and ground layers 13 and 14 provided on upper and lower surfaces of the dielectric substrate 11.

The signal line 12 has a large width section 12A having a line width W1 and a small width section 12B having a line width W2 and a line length L. One end of the small width section 12B is connected with a through-hole 15 as a capacitive load. The through-hole 15 is connected with a connection portion 16 provided on the upper surface of the dielectric substrate 11. The connection portion 16 is brought into contact with a terminal of a connector (not shown) to connect the signal line 12 with the terminal of the connector. Thus, in this embodiment, a signal is transmitted to the connector through the large width section 12A, small width section 12B, through-hole 15, and connection portion 16.

The ground layers 13 and 14 extend to substantially the whole area of the upper and lower surfaces of the dielectric substrate 11 except for regions of the through-hole 15 and the connection portion 16 and are spaced from the through-hole 15 and the connection portion 16.

The characteristic impedance of the multilayer interconnection board 11 can be adjusted by controlling the line length L (mm) of the small width section 12B of the signal line 12 as follows:

$$0 < L \leq (3 \times 10^{10})/(F \times \sqrt{\epsilon}) \quad (1)$$

wherein, $\epsilon$ denotes the dielectric constant of the dielectric substrate 11 and F (Hz) denotes the frequency of a signal transmitted through the signal line 12.

Here, the maximum value Lmax of the line length L in the above formula (1) can be controlled to become one tenth (1/10) of the wave length $\lambda$ (mm) of a signal transmitted through the signal line 12 as shown in the below-mentioned formula (2):

$$L\max = \lambda/10 \quad (2)$$

wherein, the wave length $\lambda$ is represented by the formula (3):

$$\lambda = V \times (1/F) \quad (3)$$

wherein, V denotes the speed (mm/s) of the signal, and F denotes the frequency (Hz) of the signal. The speed V of the signal is represented by the formula (4):

$$V = \{1/\sqrt{(\epsilon \times \mu)}\}\{1/\sqrt{(\epsilon_0 \times \mu_0)}\} \quad (4)$$

wherein, $\epsilon$ denotes the dielectric constant of the dielectric substrate, and $\mu$ denotes the magnetic permeability of the dielectric substrate (generally, the magnetic permeability $\mu$ of most materials is regarded as $\mu=1$), $\epsilon_0$ denotes the dielectric constant of a vacuum, $\mu_0$ denotes the magnetic permeability of a vacuum, and $1/\sqrt{(\epsilon_0 \times \mu_0)}$ denotes the speed of an electron in a vacuum (that is, it equals to the speed of light or $3 \times 10^{11}$ mm/s).

From the above relationship and formulas (2), (3), and (4), the maximum length Lmax of the small width section 12B is found by the formula (1).

When the length L of the small width section 12B is within the range represented by the formula (1), even if the signal line is connected with the capacitive load, such as the through-hole, the characteristic impedance can be surely adjusted. Consequently, the degradation of the high speed signal is prevented. Although the sectional area of the signal line 12 is decreased by the existence of the small width section 12B, the length L of the small width section 12B is restricted within the above range so that the characteristic impedance can be adjusted to minimize the generation of heat.

For example, if the dielectric substrate is made of FR-4 (the dielectric constant $\epsilon=3.9$) and the frequency F of a signal transmitted through the signal line is 1.0 GHz, the length L of the small width section 12B can be adjusted as $0 < L \leq 15.2$ mm. If the dielectric substrate is made of FR-4 (the dielectric constant $\epsilon=3.9$) and the frequency F of the signal transmitted through the signal line is 10.0 GHz, the length L of the small width section 12B can be adjusted as $0 < L \leq 1.52$ mm.

The ratio of the width W2 of the small width section 12B with respect to the width W1 of the large width section 12A, which is represented by W2/W1, can be properly adjusted according to the length of the through-hole and the length of the stub portion (a part of the through-hole under the signal line 12). For example, it is preferable that the ratio W2/W1 is adjusted to be smaller when the length of the stub portion becomes larger.

Figure 5:
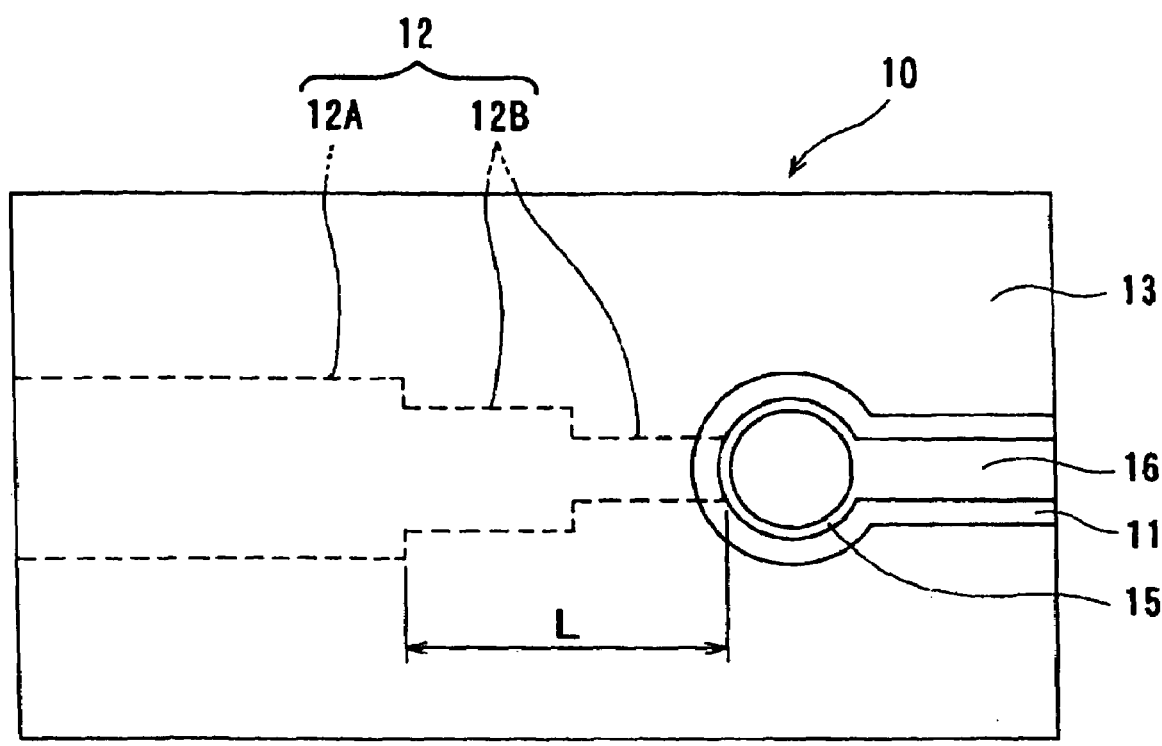
FIG. 5 is a top view of a variation of the multilayer interconnection board of FIG. 1.
Figure 6:
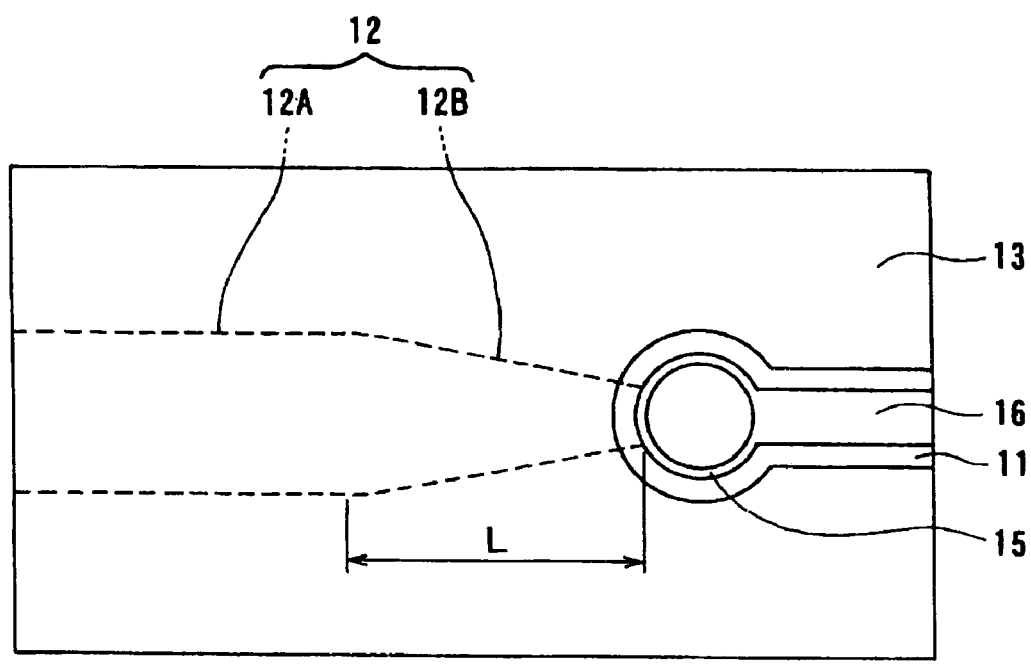
FIG. 6 is a top view of another variation of the multilayer interconnection board of FIG. 1.
Figure 7:
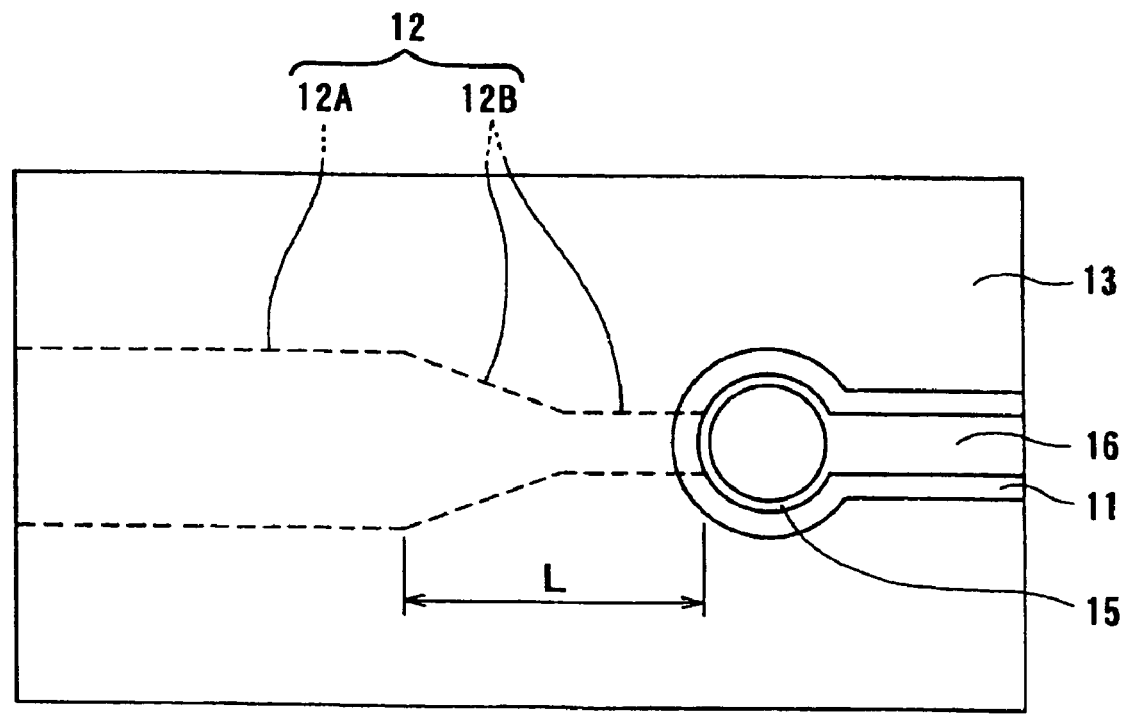
FIG. 7 is a top view of still another variation of the multilayer interconnection board of FIG. 1.

The shape of the signal line having the large and small width sections is not limited to that shown in FIG. 1. For example, in FIG. 5, the line width of the small width section becomes smaller step by step toward the through-hole, in FIG. 6, the line width becomes gradually and continuously smaller toward the through-hole in the form of a straight line, and in FIG. 7, the line width becomes gradually smaller within a limited part and then remains constant. Also, the line width may become gradually and constantly smaller toward the through-hole in the form of a curved line.

Also, the signal line may be a pair of signal lines performing data differential transmission. Further, the multilayer interconnection boar may be of a micro-strip line structure.

Examples of the present invention are described below. The present invention, however, is not limited to these examples. In FIGS. 8-11, the elements in common with those shown in FIGS. 1-7 have the same reference numerals and the description thereof will be omitted.

FIRST EXAMPLE

Figure 8:
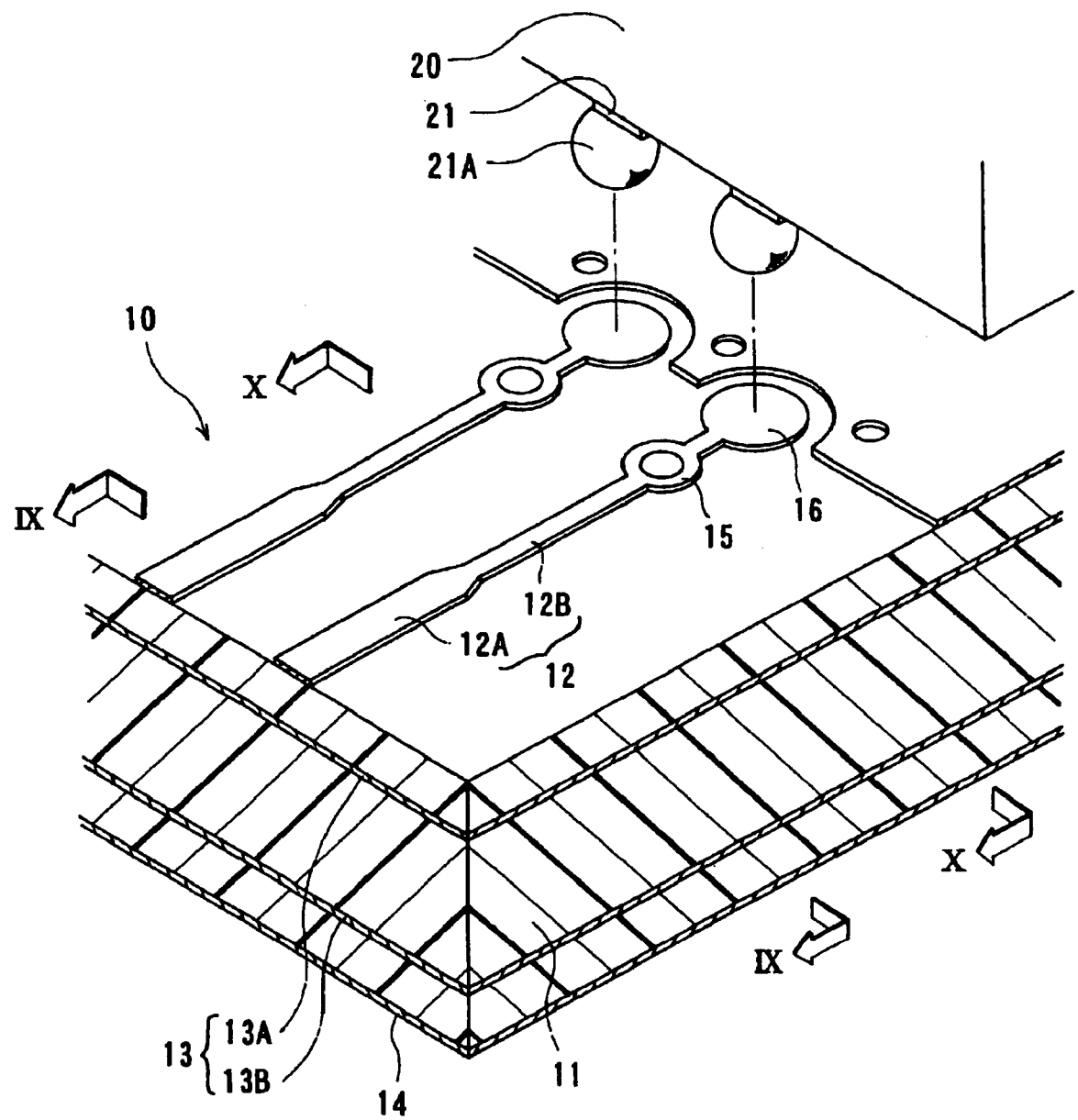
FIG. 8 is a perspective view, partly broken away, of a multilayer interconnection board according to an example of the present invention and a connector connected with the multilayer interconnection board.
Figure 9:
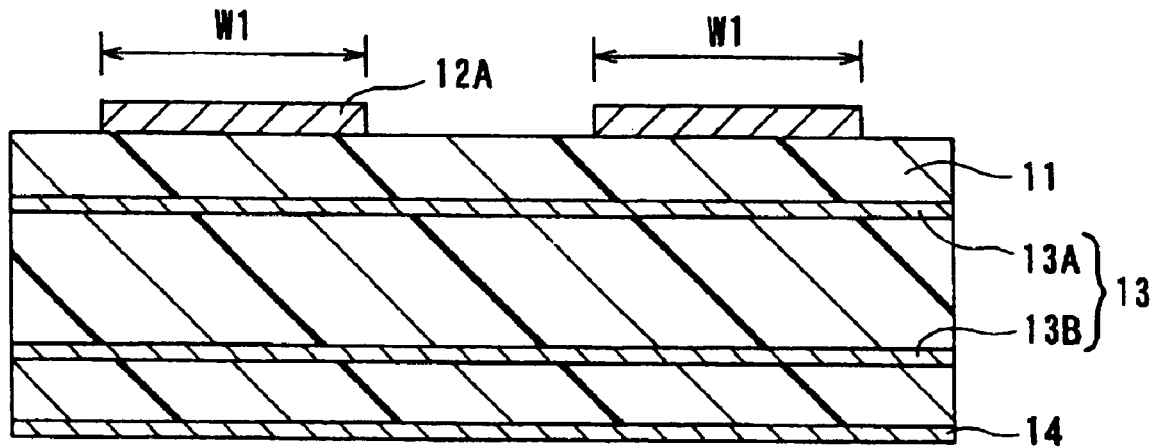
FIG. 9 is a sectional view of the multilayer interconnection board taken along line IX-IX of FIG. 8.
Figure 10:
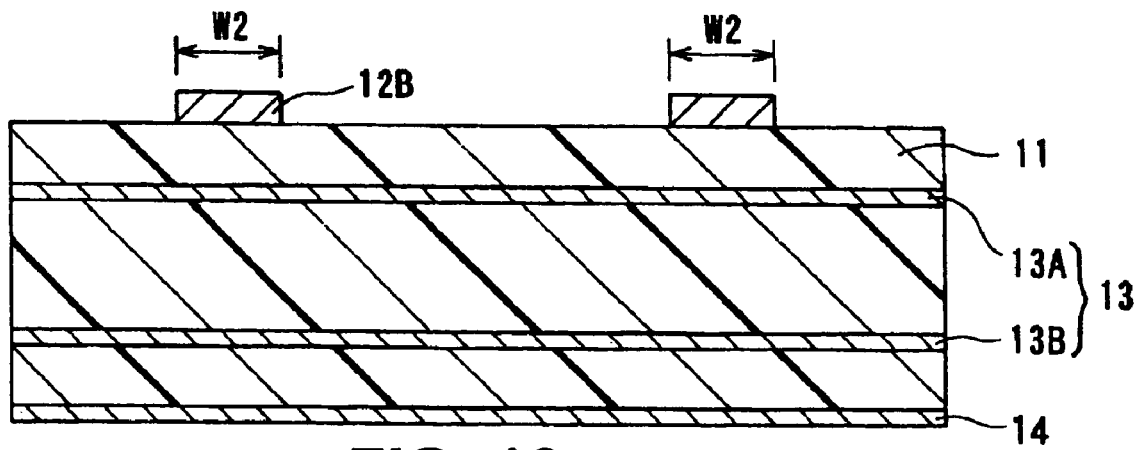
FIG. 10 is a sectional view of the multilayer interconnection board taken along line X-X of FIG. 8.

In FIGS. 8-10, a multilayer interconnection board 10 has a micro-strip line structure and comprises a dielectric substrate 11 (made of FR-4), a pair of signal lines 12 provided on a surface of the dielectric substrate 11, a ground layer 14 provided on the other surface of the dielectric substrate 11, and two ground layers 13A and 13B provided alternately in the dielectric substrate 11. A pair of through-holes 15 is provided such that they cross at right angles with the dielectric substrate 11 and the ground layers 13A, 13B, and 14. Small width sections 12B of the respective signal lines 12 are connected with the through-holes 15. Each of the through-holes 15 is communicated with a connections portion 16, with which a BGA 21A provided at a connection portion 21 of a connector 20 is solder-connected. The dielectric constant $\epsilon$ of the dielectric substrate 11 is 3.9 and the characteristic impedance is designed to be 100Ω.

Figure 11:
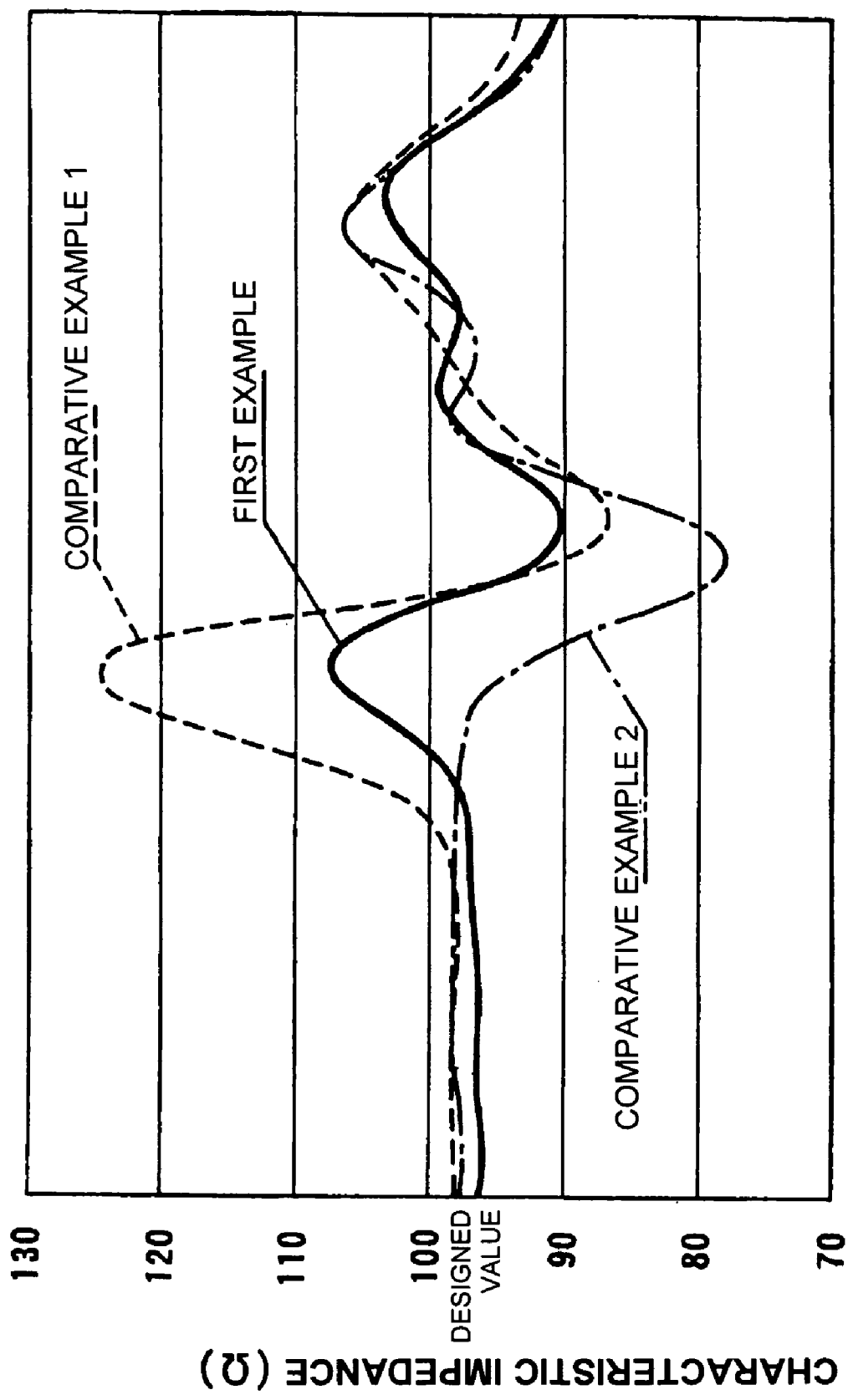
FIG. 11 is a graph of characteristic impedances of an example of the present invention and comparative examples.

In the first example, a rectangular wave of 10 GHz is transmitted through the signal line 12, which has a large width section 12A having a width W1 of 0.31 mm and a small width section 12B having a width W2 of 0.1 mm and a length L of 1.5 mm, and the characteristic impedance of a reflected signal is measured. The result of the measurement is shown in FIG. 11.

FIRST COMPARATIVE EXAMPLE

The signal line 12 of the first comparative example has a large width section 12A having a width W1 of 0.31 mm and a small width section 12B having a width W2 of 0.1 mm and a length L of 3.0 mm. The characteristic impedance is measured in the same way as in the first example and the result of the measurement is shown in FIG. 11.

SECOND COMPARATIVE EXAMPLE

The signal line 12 of the second comparative example has a single width of 0.31 mm. The characteristic impedance is measured in the same way as in the first example and the result of the measurement is shown in FIG. 11.

It is usually required that the characteristic impedance is within the range of plus minus ten percent (from +10% to −10%) with respect to the designed value (100Ω), that is, in case of the example of the present invention, the range of 90-110Ω. It is understandable from FIG. 11 that the characteristic impedances of the first and second comparative examples are not within this range, while that of the example of the present invention is within this range. Therefore, according to present invention, the characteristic impedance can be adjusted firmly and the degradation of the signal can be prevented.

The invention claimed is:

1. A multilayer interconnection board comprising:
   a dielectric substrate having a connection portion for connecting with an electrical connector;

at least one capacitive load provided on or in said dielectric substrate;

at least one signal line having a large width section and a small width section, said small width section having a first end connected with said large width section and a second end directly connected with said capacitive load; and at least one ground layer provided on a surface of or in said dielectric substrate, wherein a length L (mm) of said small width section meets a following formula:

$0 < L \leq (3 \times 10^{10})/(F \times \sqrt{\epsilon})$, wherein $\epsilon$ denotes a dielectric constant of said dielectric substrate and F (Hz) denotes a frequency of a signal transmitted through said signal line.

2. The multilayer interconnection board according to claim 1, wherein said small width section has a constant line width.

3. The multilayer interconnection board according to claim 1, wherein said small width section has a line width which becomes smaller step by step toward said capacitive load.

4. The multilayer interconnection board according to claim 1, wherein said small width section has a line width which becomes gradually smaller toward said capacitive load.

5. The multilayer interconnection board according to claim 1, wherein said small width section has a line width which becomes gradually smaller within a limited part toward said capacitive load and then remains constant.

6. The multilayer interconnection board according to claim 1, wherein said capacitive load is a through-hole.

7. The multilayer interconnection board according to claim 6, wherein a ratio (W2/W1) of a line width W2 of said small width section relative to a line width W1 of said large width section is determined to be smaller as a length of a stub portion of said through-hole becomes larger.

8. The multilayer interconnection board according to claim 6, wherein said connection portion extends from the through-hole to an edge of the dielectric substrate.

* * * * *